United States Patent
Brunner et al.

(12) 
(10) Patent No.: US 7,109,590 B2
(45) Date of Patent: Sep. 19, 2006

(54) SEMICONDUCTOR COMPONENT COMPRISING A SURFACE METALLIZATION

(75) Inventors: Herbert Brunner, Regensburg (DE); Thomas Hofer, Coppersdorf (DE); Harald Jager, Regensburg (DE)

(73) Assignee: Osram GmbH, (DE)

( * ) Notice: Subject to any disclaimer, the term of this patent is extended or adjusted under 35 U.S.C. 154(b) by 0 days.

(21) Appl. No.: 10/296,405

(22) PCT Filed: May 10, 2001

(86) PCT No.: PCT/DE01/01785

§ 371 (c)(1), (2), (4) Date: Feb. 24, 2003

(87) PCT Pub. No.: WO01/91184

PCT Pub. Date: Nov. 29, 2001

(65) Prior Publication Data

US 2003/0164537 A1 Sep. 4, 2003

(30) Foreign Application Priority Data

May 26, 2000 (DE) .............................. 100 25 774

(51) Int. Cl.
*H01L 23/48* (2006.01)
*H01L 23/52* (2006.01)

(52) U.S. Cl. ...................... 257/786; 257/692; 257/784

(58) Field of Classification Search ........ 257/688–692, 257/777, 778, 780, 781, 784, 786
See application file for complete search history.

(56) References Cited

U.S. PATENT DOCUMENTS

| 4,682,270 | A | | 7/1987 | Whitehead et al. ......... 361/764 |
| 5,081,520 | A | | 1/1992 | Yoshii et al. ............... 257/702 |
| 5,198,886 | A | | 3/1993 | Verspeek et al. ........... 257/727 |
| 5,436,492 | A | * | 7/1995 | Yamanaka ................. 257/433 |
| 5,647,122 | A | * | 7/1997 | Launay et al. .............. 29/840 |
| 5,929,516 | A | | 7/1999 | Heerman et al. ........... 257/701 |
| 6,531,334 | B1 | * | 3/2003 | Sasano ....................... 438/64 |

FOREIGN PATENT DOCUMENTS

| DE | 19746893 | 5/1999 |
| DE | 19854414 | 5/1999 |
| JP | 09-321200 | 12/1997 |
| JP | 11-145356 | 5/1999 |

* cited by examiner

*Primary Examiner*—Hung Vu
(74) *Attorney, Agent, or Firm*—Fish & Richardson P.C.

(57) ABSTRACT

The invention relates to a semiconductor component comprising surface metallization and having at least one semiconductor body (3) and a package base body (2) on whose surface conductor path structures (7) are formed by means of surface metallization. A subregion of the conductor path structure (7) constitutes the solder connections of the semiconductor component. The solder connections (1) are combined to form rows, the individual rows of solder connections being arranged at a very small, predetermined spacing from one another.

13 Claims, 2 Drawing Sheets

PRIOR ART

SEMICONDUCTOR COMPONENT COMPRISING A SURFACE METALLIZATION

CROSS-REFERENCE TO RELATED APPLICATIONS

This application is a U.S. National Phase application of PCT Application PCT/DE01/01785, published as WO 01/91184 and filed on May 10, 2001, which claims priority to German Patent Application DE 100 25 774.7 filed May 26, 2000.

FIELDS OF THE INVENTION

The invention concerns a semiconductor component comprising surface metallization.

BACKGROUND OF THE INVENTION

Semiconductor components comprising surface metallization are known, for example, from U.S. Pat. No. 5,081,520. Disclosed therein is a semiconductor component having a semiconductor body and a substrate, and comprising on its principal faces surface metallizations in the form of conductive path structures. The semiconductor body is contacted via a subregion of the conductive path structures. Another subregion of the conductive path structures serves as the connecting region of the component.

Such connection surfaces realized as surface metallization are also used in so-called MID (Molded Interconnected Device) technology and CIMID (Chip-Integrated Molded Interconnected Device) technology, as is known from U.S. Pat. No. 5,929,516, for example.

As can be seen from U.S. Pat. No. 5,081,520, the connection surfaces are ordinarily realized near the outer edges of the package or substrate. A known connection pattern consists, for example, in arranging the connection surfaces in two parallel rows extending along two opposite outer edges of the case.

A disadvantage of this arrangement is that when components of the aforesaid type have been soldered in, the solder connections readily tear away when the component is exposed to a temperature-change load. Such temperature-change loads can occur during normal operation, for example due to seasonal changes in outside temperature, during quality-control operations such as temperature-change testing and temperature shock, or during the soldering process itself.

SUMMARY OF THE INVENTION

The object of the present invention is to provide a semiconductor component comprising surface metallization and possessing improved thermal properties such as temperature stability or thermal rating. The component should further be inexpensive to manufacture.

According to the invention, it is provided to produce a semiconductor component having at least one semiconductor body and a package base body, said package base body comprising, for mounting the semiconductor component, a supporting surface on which a plurality of solder connections is formed by surface metallization, said solder connections being combined to form plural rows of solder connections. The spacing of these rows of solder connections is kept as small as possible.

"Smallest possible spacing" is to be understood as spacing that falls within a range whose lower limit is defined by the required insulation between the individual connectors and the ease of handling the component, especially during the soldering process. In particular, the spacing should be selected as so great that no short-circuits between connections occur within the component's specifications.

A further criterion for the smallest possible spacing between rows of solder connections is the sizes of the connection arrays normally used in the semiconductor industry. Preferably, the spacing between the rows of connections is roughly equal to the spacing between two adjacent solder connections in a row of such connections.

The upper limit of the aforesaid spacing range is defined by the difference between the thermal expansion coefficients of the package material and the printed-circuit-board material and by the temperature range specified for the component. This limit can be determined for the materials used in each case by means of simple temperature-change tests. These tests reveal how small the spacing between the rows of solder connections has to be in order to prevent damage to the surface metallization or the solder connections due to thermal expansion within the component's specified temperature range. This type of damage, in a component attached to a printed circuit board via the solder connections, occurs particularly as a result of mechanical stresses between the package base body and the printed circuit board, said stresses in turn being caused by a thermal expansion differential between the printed circuit board and the package base body.

The invention therefore advantageously reduces the risk of damage to the surface metallization, the solder connections, or, in the soldered-in state, the soldered joints, such as, for example, separation of the surface metallization or breakage of the soldered joints. In addition, the temperature range specified for the component can be broadened by means of the invention.

A further advantage of the invention is that because of the high-density arrangement of the solder connectors, the connection array is independent of package size.

A particularly preferred embodiment of the invention consists in arranging the rows of solder connections in parallel, since this permits an especially high-density arrangement of the individual solder connections. This arrangement is also advantageous with the use of automatic assembly systems.

It is further advantageous for the mechanical stability of the soldered-in components to arrange the two conductor paths symmetrically with respect to an axis of symmetry of the package.

In a preferred improvement of the invention, the solder connections are disposed in recesses in the package. The resulting ridges between the solder connections advantageously precisely define the spacing between the solder connection and the surface of the printed circuit board. This improvement also increases the insulation between the individual solder connections and prevents defects in the form of solder bridges.

In an especially preferred embodiment, PPA (polyphthalamide) is used as the package molding compound. This makes for very low-cost production of the component. In addition, PPA can advantageously be shaped and processed easily by automatic production machines. The invention permits the use of PPA by advantageously reducing the detrimental effects caused by different thermal expansion coefficients for the PPA component package and the printed circuit board. With components of prior art, by contrast, it is necessary to use special package materials whose thermal expansion coefficients are matched to the material of the printed circuit board. Such materials, such as LCP (liquid crystal polymer), for example, are much more expensive than PPA and are harder to process.

A preferred improvement of the invention consists of package shapes having two rows of solder connections arranged at a very small spacing from each other and each having the same number of solder connections. This arrangement simplifies in particular the conductor path structure needed for electrical bonding of the solder connections to the semiconductor body.

In terms of resistance to thermal cycling, the invention allows a much larger number of contact connections than do components of prior art.

BRIEF DESCRIPTION OF THE DRAWING

Further features, advantages and suitabilities of the invention will emerge from the following description of two exemplary embodiments in conjunction with FIGS. 1 to 3. Like elements have been provided with like reference numerals. In the drawing.

DETAILED DESCRIPTION OF THE INVENTION

Figure 1A:
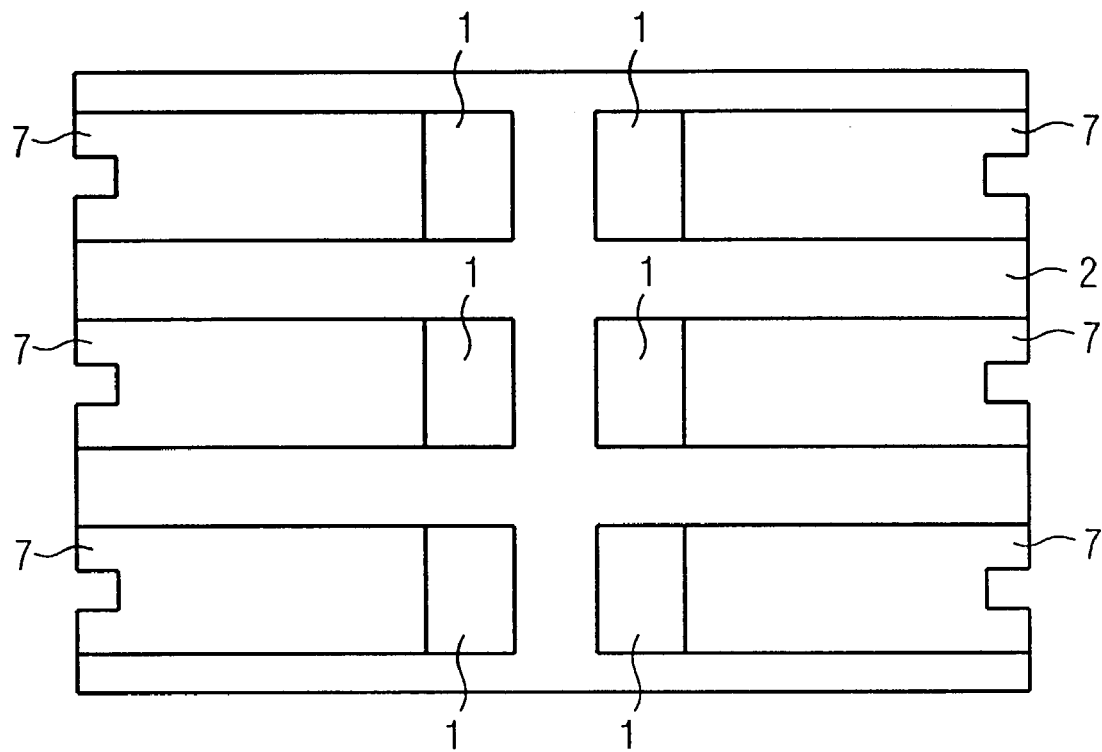
FIG. 1 is a schematic diagram of a first embodiment of a component according to the invention.
Figure 1B:
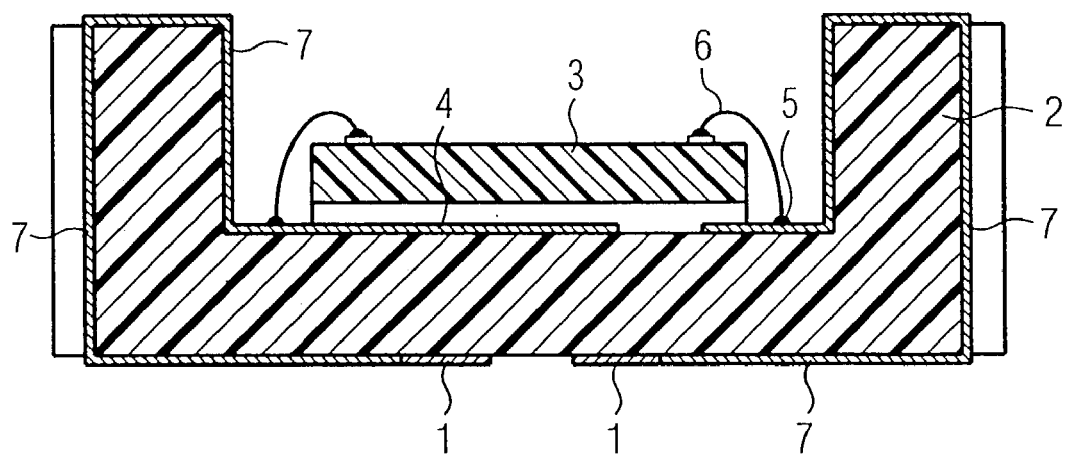

FIG. 1b is a cross-sectional view of a semiconductor component manufactured by MID technology. In MID or CIMID technology, the package is a base body 2 with a recess in which the semiconductor body 3 is disposed. Formed on the package base body 2, by means of surface metallization, are conductor path structures 7, which within the recess form the chip connection region 4 and the wire connection region 5 for contacting the semiconductor body 3. The electrical bond between the semiconductor body 3 and the conductor path structures 7 can be made by means of wire bonds 6, for example.

On the outside of the package, solder connections 1 are realized in the form of conductor path structures 7. The electrical bond between chip connection region 4 or wire connection region 5 and the solder connections 1 is also made by means of conductor paths 7 extending over the surface of package base body 2.

FIG. 1a is an elevation of the side of the package on which the solder connections 1 are realized. The total of six solder connections are arranged in two rows of three connections each (the number naturally does not constitute a limitation of the invention), with the rows extending in parallel and arranged in close proximity to each other. This high-density arrangement prevents sharp displacement of the solder connections 1 due to thermal expansion of the package base body 2. "Displacement" in this context denotes the distance by which a given solder connection 1 shifts relative to the printed circuit board due to expansion of the package base body 2 upon heating or cooling within the temperature interval considered. The favorable thermal behavior imparted to the component by means of the invention derives from the fact that in a linear approximation, the magnitude of the displacement is proportional to the spacing of the solder connections; thus, a high-density arrangement of solder connections 1 with very small spacing between them has the consequence of very small displacement of the solder connections 1, as well. When the component is in the soldered-in state, very small displacement results in very low stress at the solder joints and thus reduces the risk that the joints will break.

Figure 3:
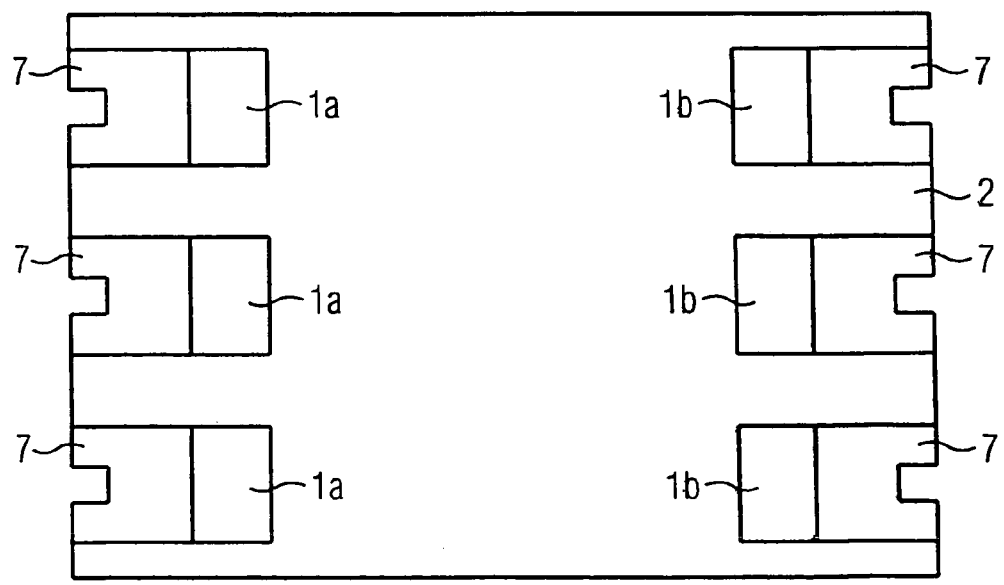
FIG. 3 is a schematic diagram of a component according to the invention.

For purposes of comparison, a solder-joint arrangement of prior art is shown in FIG. 3. Here, the solder connections 1a, 1b are arranged in two rows along and close to the edges of the package. The oppositely disposed solder connections 1a and 1b are therefore far apart. This results in the above-described large displacements in response to thermal expansion and to solder joints that unstable under temperature-change stress.

Figure 2:
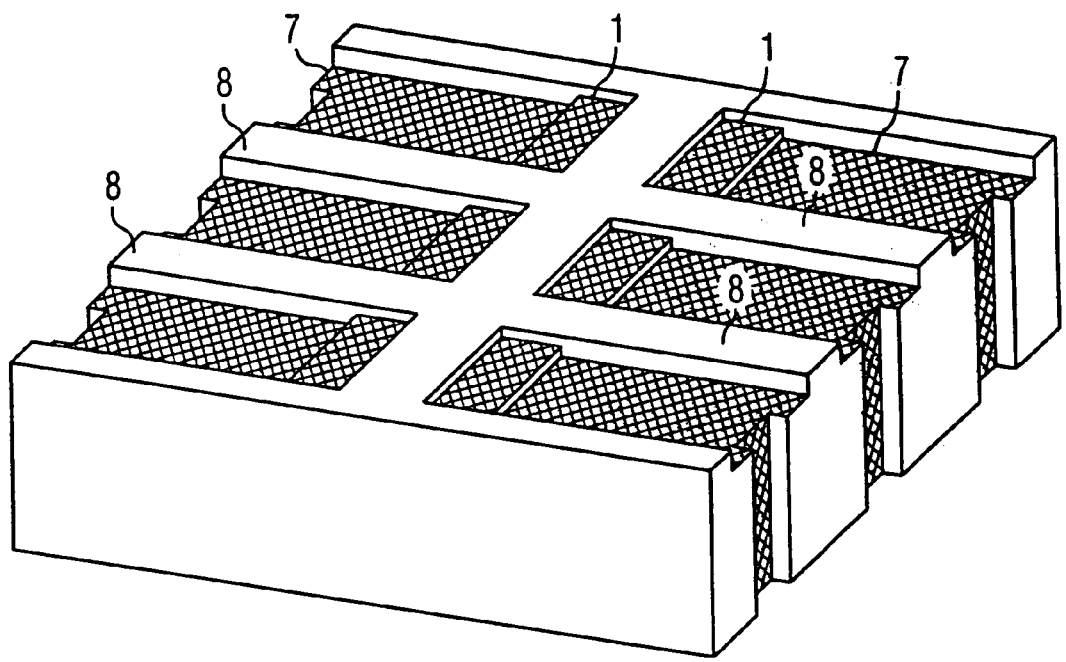
FIG. 2 is a schematic diagram of a second embodiment of a component according to the invention.

A further exemplary embodiment is illustrated in perspective in FIG. 2. Here, the conductor paths 7 and the solder connections 1 are disposed in recesses in the top side of the package. When the component is in the built-in state, the resulting ridges 8 between the conductor paths lie directly on the printed circuit board and precisely and reproducibly define the spacing between the solder connections 1 and the printed circuit board. This fixing further increases the quality of the solder joints between the printed circuit board and the component.

Furthermore, the individual solder connections 1 are efficiently isolated from one other by the ridges 8. This prevents defects in the form of solder bridges from forming between the individual solder connections 1 during the mounting process.

Thermoplastics such as PPA, for example, can be used as the package material. These materials have proven satisfactory in the manufacture of packages by injection molding, but their thermal expansion coefficients differ sharply from those of typical printed-circuit-board materials such as FR4, for example.

Alternative materials having thermal expansion coefficients similar to those of printed-circuit-board materials, for example LCP, are much more expensive, are more difficult to use in injection molding processes, or do not metallize as well as PPA. Thermoplastics such as PPA can advantageously be used as package molding compounds for components according to the invention.

The depicted packages manufactured by CIMID technology are suitable for fabricating relatively large, three-dimensional component structures. An additional area of application for these packages is optical components, such as, for example, light-emitting diodes, photodiodes or reflex light barriers, in which the recess over the semiconductor body is covered with suitable radioparent materials. Naturally, the invention is not limited to this exemplary embodiment or to those described hereinabove, but constitutes a connection design for surface-metallized components that increases the thermal rating of the components in the built-in state.

What is claimed is:
1. A semiconductor component comprising:
at least one semiconductor body; and
a package base body supporting the semiconductor body on a top surface and having multiple conductor paths terminating in plural rows of solder connections,
wherein the solder connections are arranged in separate recesses which run along a bottom outer surface of the base body, and
wherein the rows are spaced from one another by a distance sufficiently large to avert short circuits and sufficiently small to prevent damage to the conductor paths or the solder connections from thermally induced expansion of the package base body.

2. The semiconductor component of claim 1, wherein the rows of solder connections are arranged in parallel.

3. The semiconductor component of claim 1, wherein the rows of solder connections are arranged symmetrically with respect to an axis of symmetry of the package base body.

4. The semiconductor component of claim 1, wherein the package base body comprises a molding compound.

5. The semiconductor component of claim 4, wherein the molding compound comprising polyphthalamide.

6. The semiconductor component claim 1, wherein the conductor paths define rows of conductor paths on the top surface, and wherein each row of conductor paths corresponds to one of the rows of solder connections.

7. The semiconductor component of claim 1, wherein the solder connections are on a bottom surface of the package base body opposite the top surface.

8. The semiconductor component of claim 1, wherein the rows of solder connections are spaced from one another by a distance smaller than the semiconductor body.

9. The use of the semiconductor component of claim 1 to make light-emitting diodes, photodiodes and reflex light barriers.

10. The use of the semiconductor component of claim 1 to make any of light-emitting diodes, photodiodes, and reflex light barriers.

11. A light-emitting diode comprising the semiconductor component of claim 1.

12. A photodiode comprising the semiconductor component of claim 1.

13. A reflex light barrier comprising the semiconductor component of claim 1.

* * * * *